US006642771B1

United States Patent
Smetana (10) Patent No.: US 6,642,771 B1
(45) Date of Patent: Nov. 4, 2003

(54) INTEGRATED XOR/SUMMER/ MULTIPLEXER FOR HIGH SPEED PHASE DETECTION

(75) Inventor: Kenneth Smetana, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 10/135,415

(22) Filed: Apr. 30, 2002

(51) Int. Cl.[7] .............................................. H03K 17/62
(52) U.S. Cl. .......................... 327/411; 327/12; 327/56; 327/65
(58) Field of Search ................................ 327/411, 407, 327/408, 432, 2, 7, 8, 12, 39, 40, 50–52, 56, 63–65, 68–70; 326/48, 52

(56) References Cited

U.S. PATENT DOCUMENTS

| 3,617,855 A | * 11/1971 | Hisatsu | ........................ 363/148 |
| 4,870,303 A | * 9/1989 | Mcginn | ............................ 327/2 |
| 5,694,062 A | * 12/1997 | Welch et al. | .................... 327/3 |
| 5,799,048 A | * 8/1998 | Farjad-Rad et al. | ......... 375/360 |
| 6,072,337 A | * 6/2000 | Dalmia et al. | ................. 327/12 |
| 6,137,852 A | * 10/2000 | Mcginn et al. | .............. 375/375 |
| 6,435,037 B1 | * 8/2002 | Doten | ...................... 73/861.27 |

* cited by examiner

Primary Examiner—Timothy P. Callahan
Assistant Examiner—Hai L. Nguyen
(74) Attorney, Agent, or Firm—Incaplaw; Terrance A. Meador (57) ABSTRACT

A high speed phase detector utilizes an integrated XOR/SUMMER/MUX circuit having a higher bandwidth and lower power than conventional designs. The XOR/SUMMER/MUX circuit combines the functionality of two parallel XOR devices in series with a summer/multiplexer in a manner that reduces the number of gate delays associated with the input signals. In a practical implementation, the XOR/SUMMER/MUX circuit includes XOR arrangements having a plurality of transistors implemented at a first transistor level and a plurality of transistors implemented at a second transistor level. The XOR/SUMMER/MUX circuit also includes transistors implemented at a third transistor level; these transistors are utilized by the multiplexer feature of the circuit.

18 Claims, 9 Drawing Sheets

INTEGRATED XOR/SUMMER/MULTIPLEXER FOR HIGH SPEED PHASE DETECTION

RELATED APPLICATION

The subject matter described herein is related to the subject matter of U.S. patent application Ser. No. 10/135,112 titled "INTEGRATED XOR/MULTIPLEXER FOR HIGH SPEED PHASE DETECTION," the content of which is incorporated by reference herein.

FIELD OF THE INVENTION

The present invention relates generally to digital and analog circuit design. More particularly, the present invention relates to a digital circuit that combines the functionality of two parallel XOR gates in series with a summer/multiplexer.

BACKGROUND OF THE INVENTION

Figure 1:
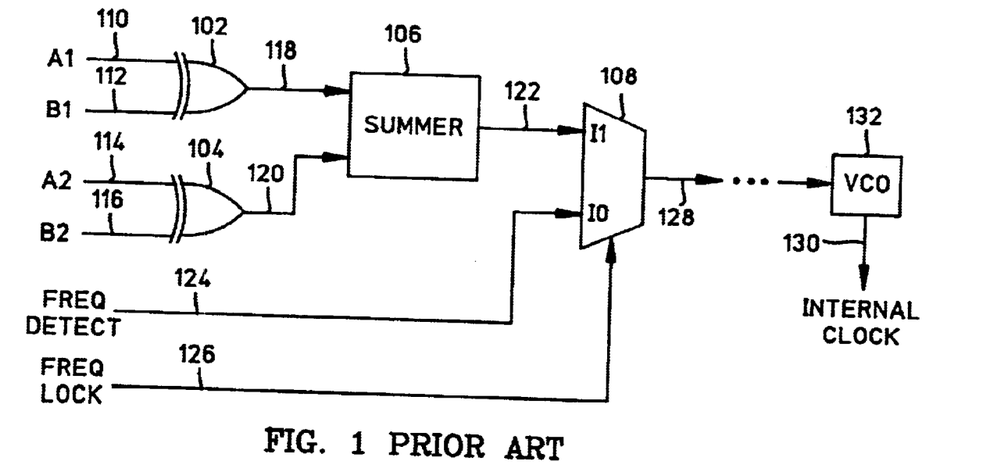
FIG. 1 is a block diagram of a prior art digital circuit.

High speed digital data communication devices utilize phase detector circuits to produce an output voltage proportional to the frequency or phase differences of two input signals. During frequency acquisition, the frequency of an incoming data signal is compared to the frequency of an external reference clock. During phase acquisition, incoming data is compared to a derived version of an internal reference clock (usually generated by a voltage controlled oscillator). FIG. 1 is a block diagram of a prior art digital circuit 100 that may be utilized in a phase detector application. Circuit 100 includes an XOR component 102, an XOR component 104, a summer 106 that receives the outputs of the two XOR components, and a multiplexer 108 connected in series with summer 106. One input to XOR component 102 is a data signal 110 that represents a first sampled version of an input data signal, and the other input to XOR component 102 is a data signal 112 that represents a second sampled version of the input data signal. Similarly, one input to XOR component 104 is a data signal 114 that represents a third sampled version of the input data signal, and the second input to XOR component 104 is a data signal 116 that represents a fourth sampled version of the input data signal.

The output of XOR component 102 serves as one input 118 to summer 106, and the output of XOR component 104 serves as a second input 120 to summer 106. Summer 106 functions to generate different voltage levels in response to the logic levels of inputs 118/120. The output of summer 106 represents a phase detect signal 122. If both inputs 118/120 are logic low, then phase detect signal 122 exhibits a relatively low voltage level. If both inputs 118/120 are logic high, then phase detect signal 122 exhibits a relatively high voltage level. If one input is a logic low and the other is a logic high, then phase detect signal 122 exhibits a relatively intermediate voltage level.

Circuit 100 also receives a frequency detect signal 124 from a frequency detection circuit (not shown) and a frequency lock signal 126 (frequency lock signal 126 serves as a selection signal for multiplexer 108). Ultimately, circuit 100 generates an output signal 128—the output of multiplexer 108. Circuit 100 utilizes output signal 128 to adjust the frequency and phase of a clock signal 130 generated by a voltage controlled oscillator (VCO) 132. Initially, circuit 100 selects frequency detect signal 124 (using multiplexer 108) for use as output signal 128, which controls the operation of VCO 132 such that the frequency of clock signal 130 matches the frequency of the incoming data signal. Thereafter, circuit 100 selects phase detect signal 122 (using multiplexer 108) for use as output signal 128, which controls the operation of VCO 132 such that the phase of clock signal 130 is properly aligned relative to the phase of the input data signal.

Figure 2:
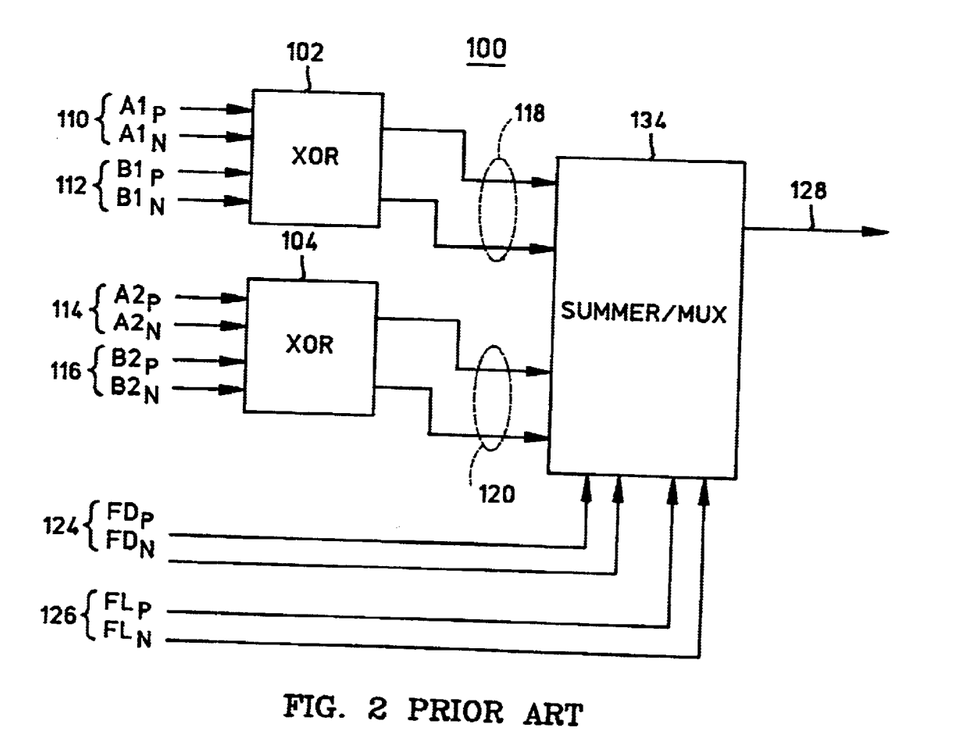
FIG. 2 is a block diagram representing a practical implementation of the circuit shown in FIG. 1.

FIG. 2 is a schematic representation of circuit 100 as implemented in a practical device. In a practical high speed application, circuit 100 handles differential input signals and generates a single-ended output signal 128. Accordingly, XOR input signal 110 is represented by a positive or "true" signal ($A1_P$) and a negative or "complementary" signal ($A1_N$), XOR input signal 112 is represented by a positive signal ($B1_P$) and a negative signal ($B1_N$), XOR input signal 114 is represented by a positive signal ($A2_P$) and a negative signal ($A2_N$), and XOR input signal 116 is represented by a positive signal ($B2_P$) and a negative signal ($B2_N$) Likewise, frequency detect signal 124 is represented by a positive signal ($FD_P$) and a negative signal ($FD_N$), and frequency lock signal 126 is represented by a positive signal ($FL_P$) and a negative signal ($FL_N$).

Figure 3:
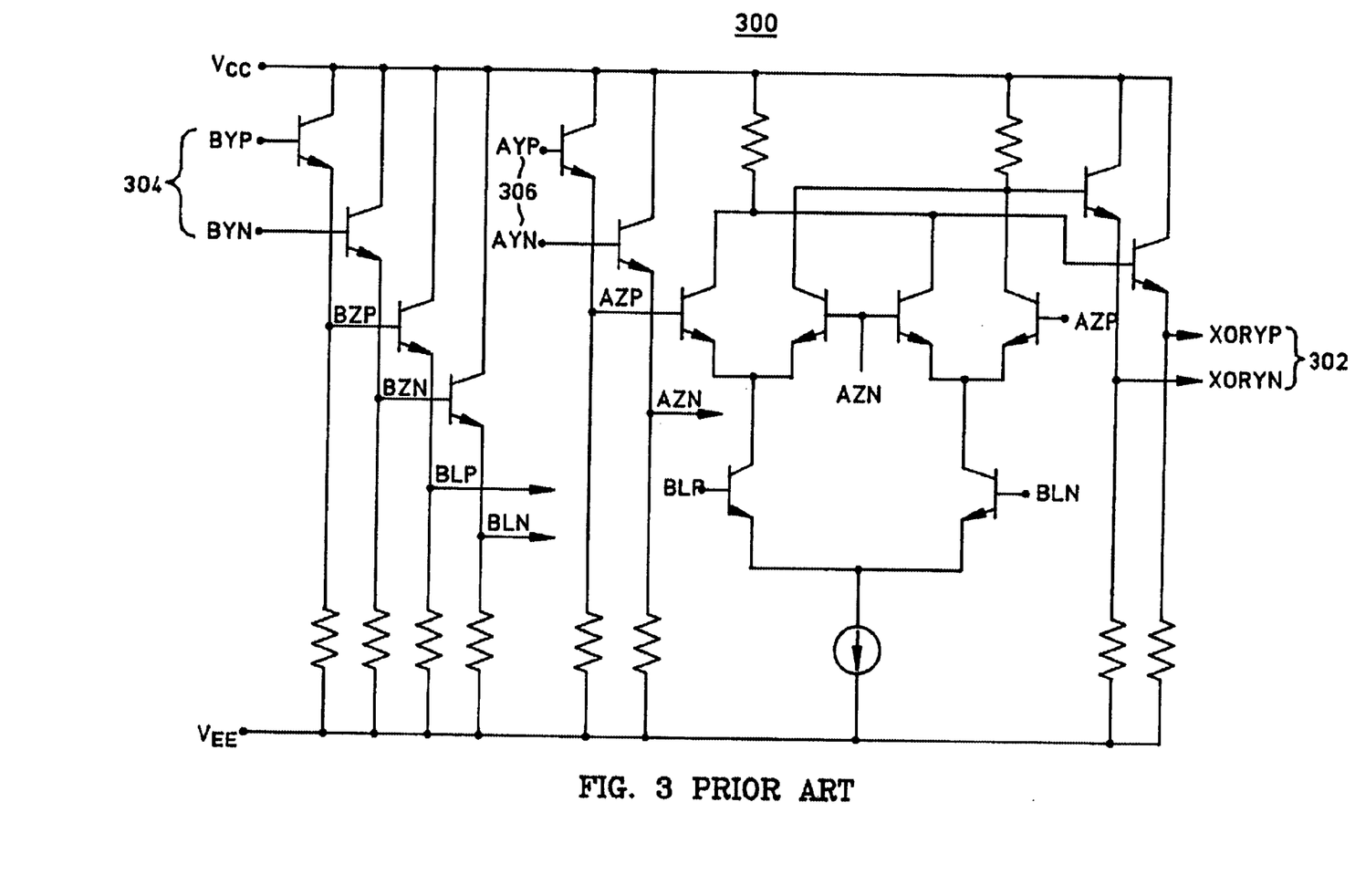
FIG. 3 is a schematic diagram of a prior art XOR component.
Figure 4A:
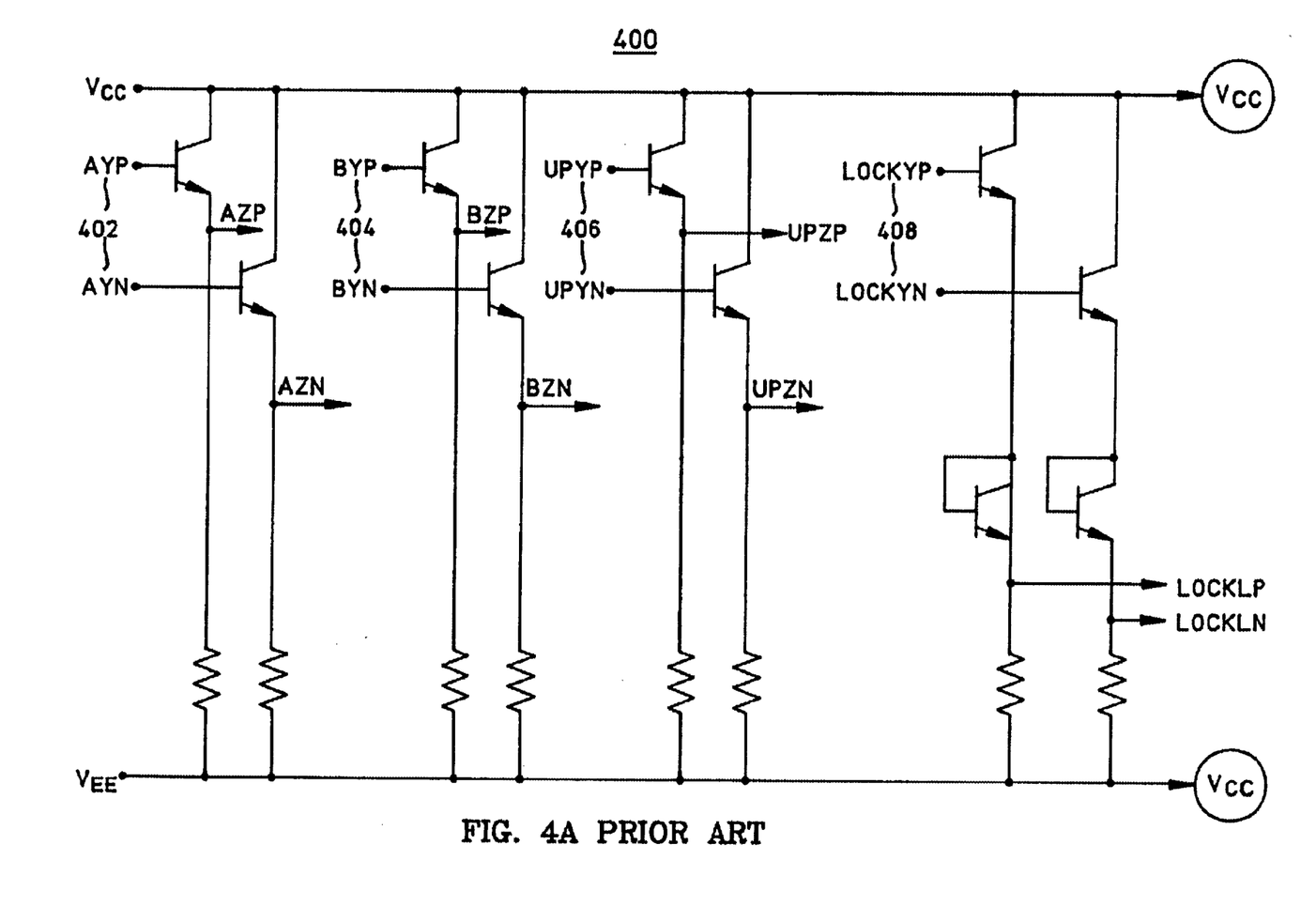
FIG. 4 is a schematic diagram of a prior art summer/MUX component.
Figure 4B:
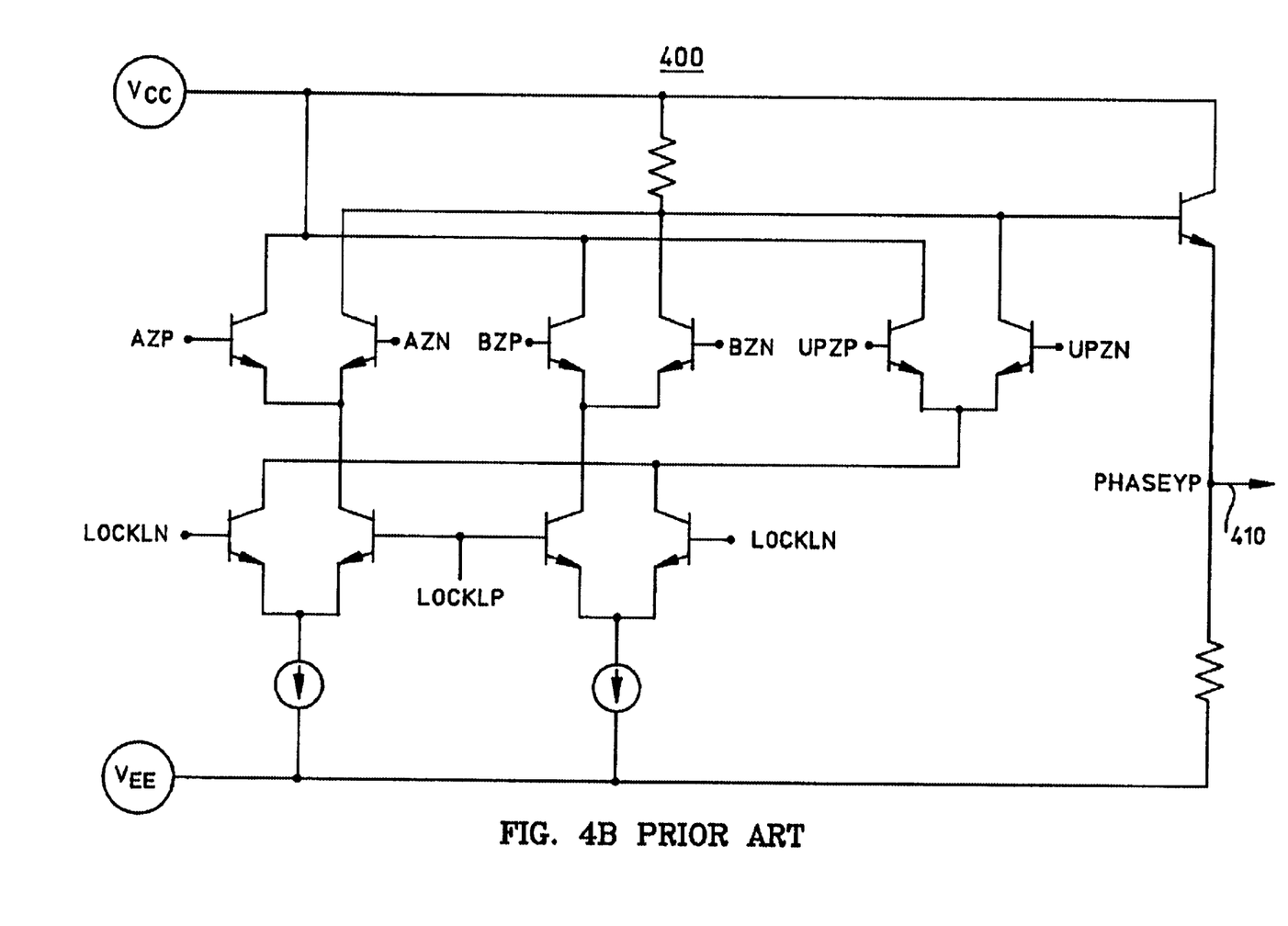

Circuit 100 is implemented such that: the transistors, resistors, and other features of XOR component 102 define one physically distinct circuit; the transistors, resistors, and other features of XOR component 104 define a second physically distinct circuit; and the transistors, resistors, and other features of summer 106 and multiplexer 108 combine to define a third physically distinct circuit. This third circuit is shown in FIG. 2 as a summer/MUX component 134. In this regard, FIG. 3 is a schematic of a prior art XOR component 300, and FIG. 4 is a schematic of a prior art summer/MUX component 400. XOR component 300 is designed to operate as an independent device that generates a differential XOR output 302 based upon two differential input signals 304/306, and summer/MUX component 400 is designed to operate as an independent device that receives two differential input signals 402/404 (corresponding to the outputs of two XOR components), a differential frequency detect signal 406, and a differential frequency lock signal 408. Summer/MUX component 400 generates an output signal 410 based upon either frequency detect signal 406 or a sum of input signals 402/404, under the control of frequency lock signal 408. Referring back to FIG. 2, in a practical implementation, XOR component 102 and XOR component 104 are each physically connected to summer/MUX component 134 using conductive traces configured to carry signals 118/120 between the components.

Circuit 100, while suitable for relatively low speed data communication applications (e.g., those handling data rates of 2.5 Gbps or less), is not suitable for relatively high speed applications (e.g., those handling data rates up to or beyond 40 Gbps). In very high speed applications, the limited bandwidth of circuit 100 adversely affects its performance. Furthermore, circuit 100 requires separate current sources (one or more for each XOR component and one or more for summer/MUX component 134), which results in an inefficient use of operating power.

BRIEF SUMMARY OF THE INVENTION

A circuit according to the present invention includes the functionality of two XOR components integrated with the functionality of a summer and a multiplexer. The combined function of the circuit is equivalent to distinct XOR components connected in series with a distinct summer/multiplexer component. The integrated configuration enables the circuit to achieve higher bandwidth than equivalent prior art circuits, while using less operating power.

The above and other aspects of the present invention may be carried out in one form by an integrated device having: a reference voltage node; an output voltage node; a first XOR arrangement coupled to the reference voltage and output voltage nodes, where the first XOR arrangement is configured to perform an XOR operation based upon a first input signal and a second input signal; a second XOR arrangement coupled to the reference voltage and output voltage nodes, where the second XOR arrangement is configured to perform an XOR operation based upon a third input signal and a fourth input signal; an input arrangement coupled to the reference voltage and output voltage nodes, where the input arrangement is configured to receive a fifth input signal; and a MUX arrangement coupled to the first XOR arrangement, to the second XOR arrangement, and to the input arrangement, where the MUX arrangement is configured to select either the input arrangement or the first and second XOR arrangements for operation in response to a select signal.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The specific circuits shown and described herein are illustrative of the invention and its best mode and are not intended to otherwise limit the scope of the invention in any way. Indeed, for the sake of brevity, conventional aspects of microelectronic design techniques, semiconductor fabrication techniques, digital logic techniques, and other functional aspects of the circuits (and the individual operating components of the circuits) may not be described in detail herein. In addition, the present invention may be practiced in conjunction with any number of digital/analog circuit applications and the system described herein is merely one exemplary application for the invention.

Figure 5:
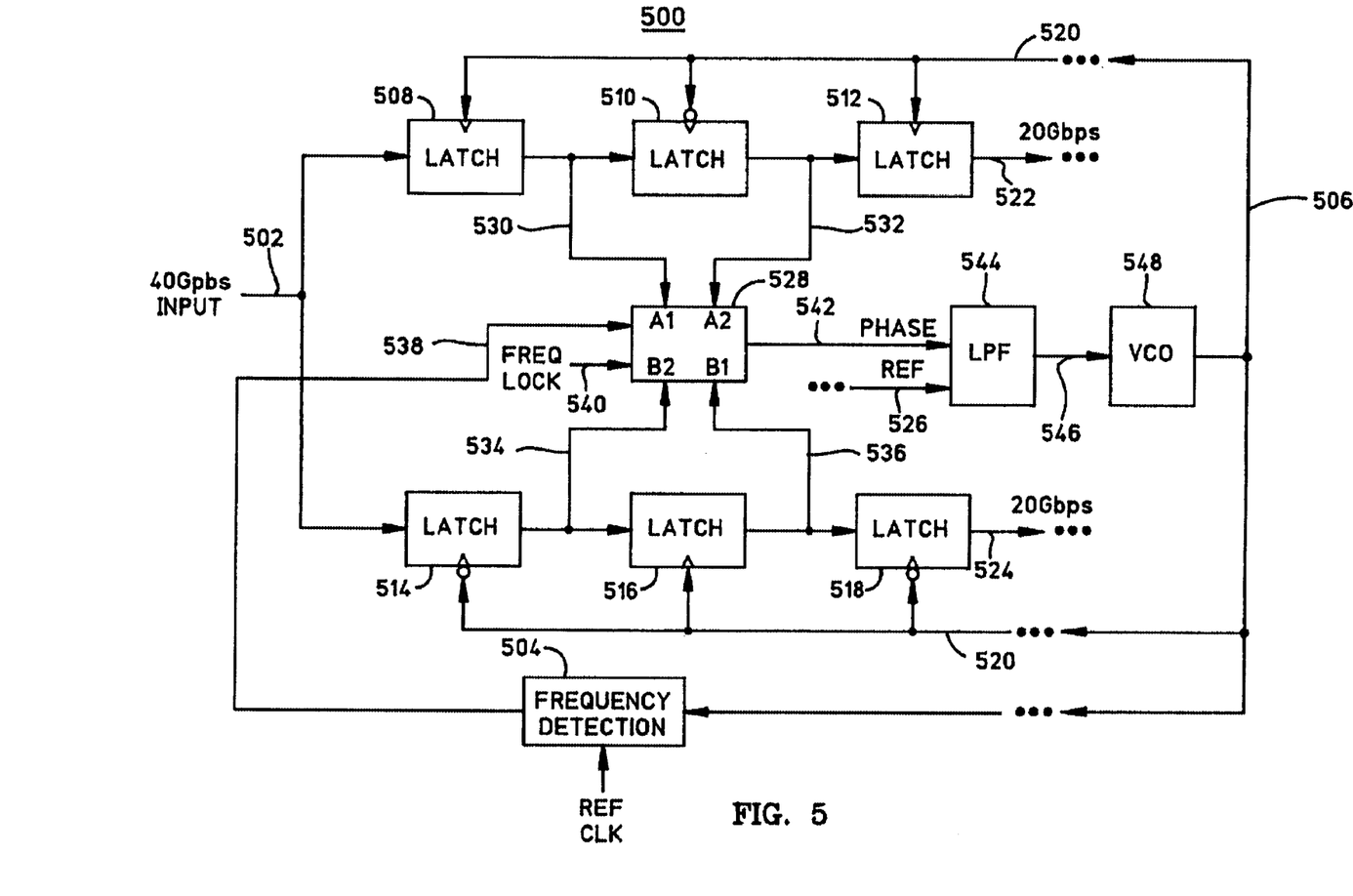
FIG. 5 is a block diagram of an example phase detector circuit in which the present invention may be implemented.

FIG. 5 is a block diagram of a digital circuit 500 that may utilize a practical embodiment of the present invention. Briefly, circuit 500 represents a portion of a phase detection circuit that receives a digital data input signal 502, performs a frequency detection procedure 504 to generate an internal clock 506 having a frequency that matches the frequency of input signal 502, and performs a phase detection procedure to align the frequency-matched internal clock 506 relative to input signal 502. In one practical embodiment, circuit 500 is suitably configured to accommodate an input signal having a data rate of 40 Gbps (and possibly higher data rates). Most of the various signals depicted in FIG. 5 are typically realized as differential signals, each having a true component and a complementary component. For the sake of clarity, however, these signals are represented by single interconnecting lines in FIG. 5. Two notable exceptions are the phase and reference input signals to the low pass filter ("LPF"); in the preferred practical embodiment, each of these signals is a single-ended data signal.

In operation, circuit 500 splits the incoming input signal 502 for sampling by two branches of series latches. In this regard, circuit 500 includes latches 508/510/512 corresponding to one branch and latches 514/516/518 corresponding to another branch. Latches 508/512/516 sample data with the rising edges of a clock signal 520 (which is based upon clock signal 506), and latches 510/514/518 sample data with the falling edges of clock 520. The output 522 of latch 512 represents the odd bit data from input signal 502, while the output 524 of latch 518 represents the even bit data from input signal 502 (alternatively, the even/odd bit data distribution can be reversed); signals 522/524 collectively convey the same digital data found in input signal 502. The data rate of each signal 522/524 is half the data rate of input signal 502. In this regard, the example circuit 500 generates a 20 Gbps signal 522 and a 20 Gbps signal 524. Although the specific circuitry is not depicted in FIG. 5, signals 522/524 are utilized to generate a reference signal 526, which conveys information related to the phase of internal clock 506 relative to input signal 502.

Circuit 500 also includes an integrated XOR/SUMMER/MUX circuit 528, which receives a number of input signals 530/532/534/536, a frequency detect signal 538 (generated by the frequency detection procedure 504), and a frequency lock signal 540. Signal 530 is the sampled output of latch 508, signal 532 is the sampled output of latch 510, signal 534 is the sampled output of latch 514, and signal 536 is the sampled output of latch 516. Frequency lock signal 540 functions as a select signal for XOR/SUMMER/MUX circuit 528 such that, in a first operating mode, the output of XOR/SUMMER/MUX circuit 528 corresponds to frequency detect signal 538, and such that, in a second operating mode, the output of XOR/SUMMER/MUX circuit 528 corresponds to the sum of the output of two XOR operations—the first XOR operation is performed on input signals 530/536, and the second XOR operation is performed on input signals 532/534. The output of XOR/SUMMER/MUX circuit 528 is a single-ended "phase" signal 542 that serves as one input to an LPF 544. As mentioned above, LPF 544 also receives single-ended "reference" signal 526 as a second input.

The output signal 546 of LPF 544 is directed to a VCO 548, which is configured to generate internal clock 506 in response to the output signal 546; VCO 548 modifies the frequency and/or phase of internal clock 506 in accordance with signal 546. In this regard, signal 546 serves as a VCO adjustment or control signal. As shown in FIG. 5, internal clock 506 (or any number of clocks derived therefrom) may be utilized by the latches and/or by frequency detection procedure 504.

As described in more detail below, the present invention is embodied in XOR/SUMMER/MUX circuit 528. Consequently, circuit 500 may utilize a number of known and conventional techniques (in addition to the techniques of the present invention) to perform phase detection.

Figure 6:
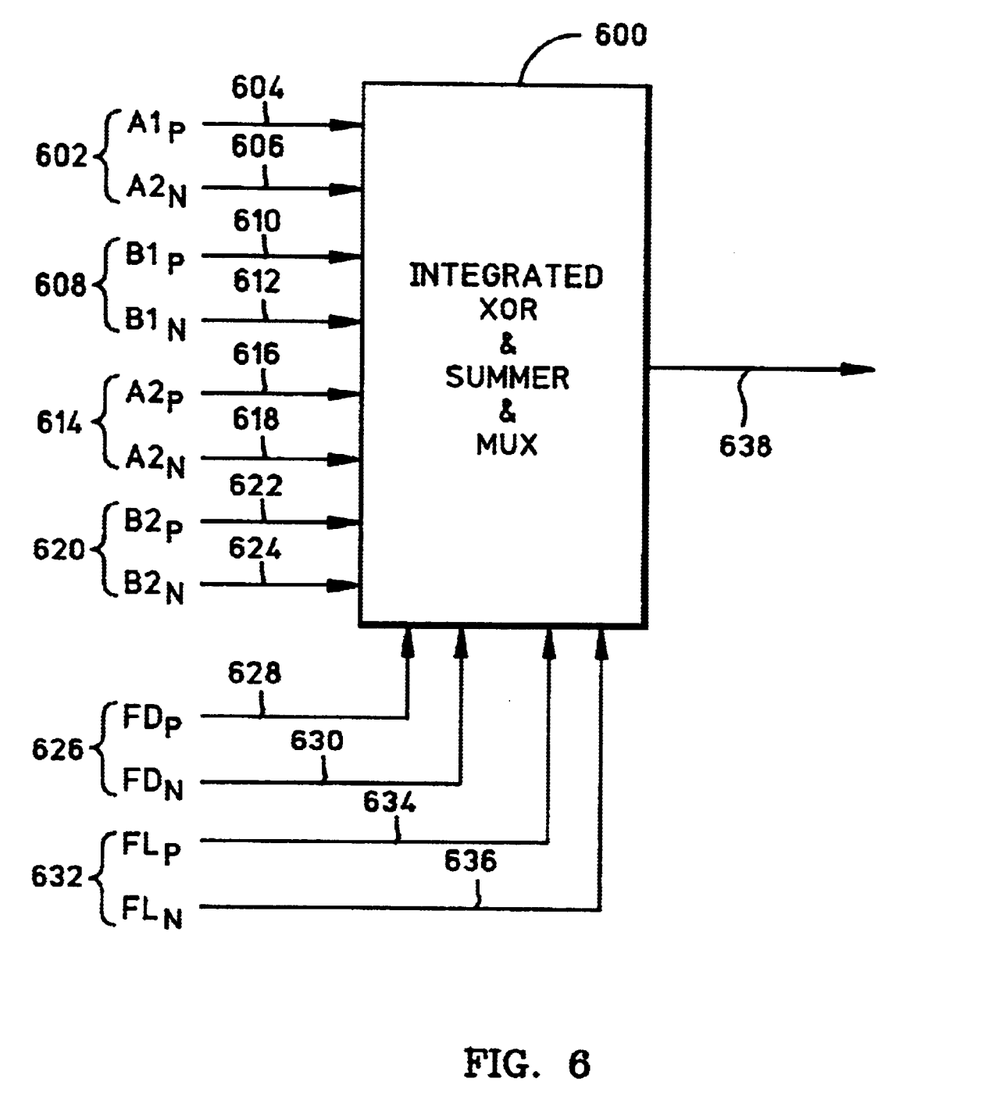
FIG. 6 is a block diagram of a digital circuit according to the present invention.

FIG. 6 is a block diagram of an integrated XOR/SUMMER/MUX circuit 600 according to the present invention. Circuit 600 represents one practical implementation of XOR/SUMMER/MUX circuit 528 (shown in FIG. 5). Circuit 600 is configured to receive a first differential input signal 602, which includes a true component 604 and a complementary component 606, a second differential input signal 608, which includes a true component 610 and a complementary component 612, a third differential input signal 614, which includes a true component 616 and a complementary component 618, and a fourth differential input signal 620, which includes a true component 622 and a complementary component 624. Circuit 600 is also configured to receive a differential frequency detect signal 626, which includes a true component 628 and a complementary component 630, and a differential frequency lock signal 632, which includes a true component 634 and a complementary component 636. Circuit 600 generates a single-ended output signal 638 in response to the various input signals and in response to frequency lock signal 632. Depending upon the state of frequency lock signal 632, output signal 638 represents either frequency detect signal 626 or an output signal derived from input signals 602/608/614/620.

In the example embodiment described herein, first differential input signal 602 represents the A1 signal 530 shown in FIG. 5, second differential input signal 608 represents the B1 signal 536 shown in FIG. 5, third differential input signal 614 represents the A2 signal 532 shown in FIG. 5, and fourth differential input signal 620 represents the B2 signal 534 shown in FIG. 5. In the example embodiment, differential frequency detect signal 626 is generated by a suitable frequency detection procedure or architecture, and differential frequency lock signal 632 is utilized as a selection signal for the multiplexer feature of circuit 600.

Notably, XOR/SUMMER/MUX circuit 600 is realized on a single substrate as an integrated component or device. In contrast to the prior art circuit 100 shown in FIG. 2, circuit 600 does not include conductive signal traces that connect distinct XOR circuits to a distinct summer/multiplexer circuit. In other words, circuit 600 does not include a distinct summer/multiplexer that receives XOR output signals generated by distinct XOR elements.

Figure 7A:
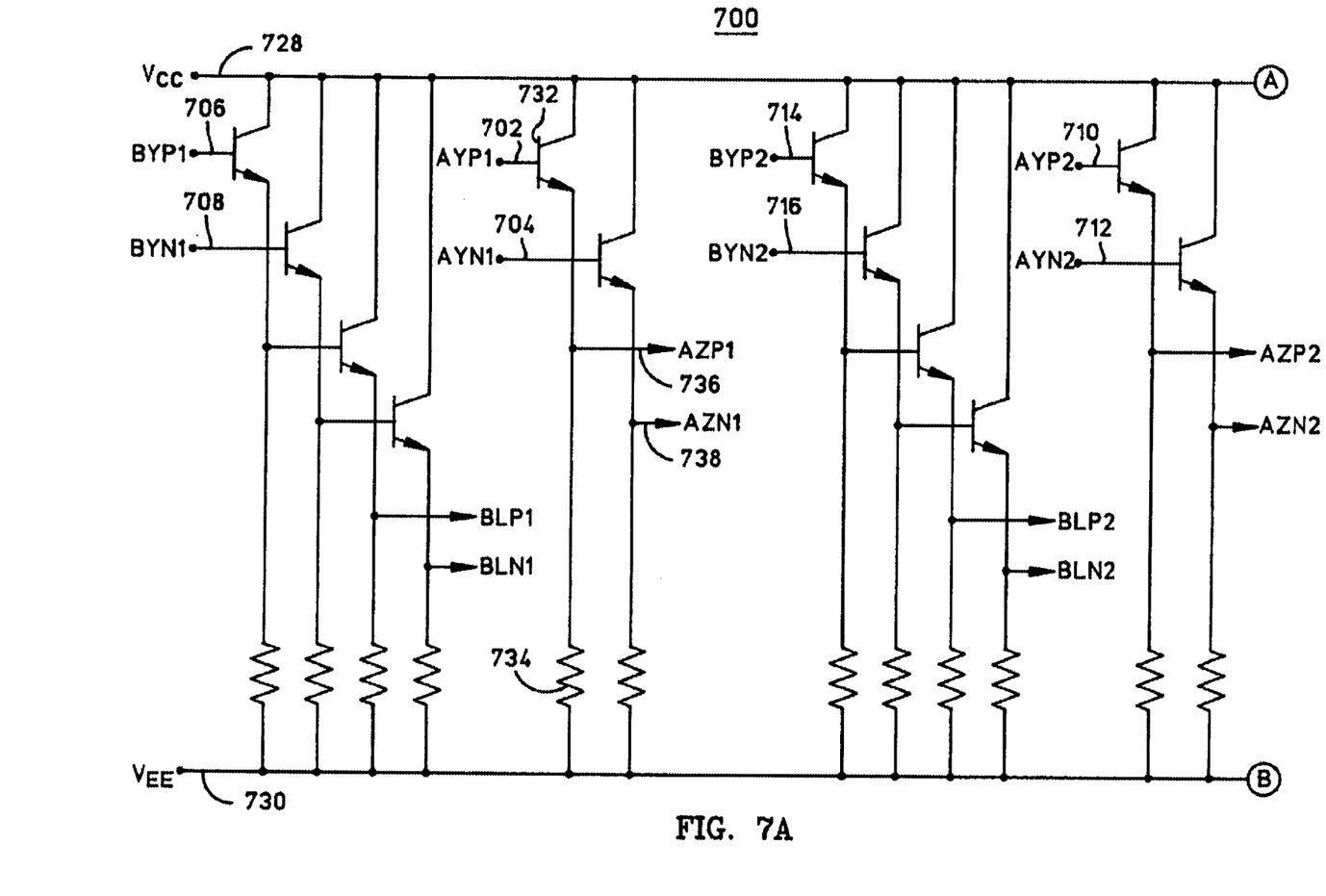
FIG. 7 is a schematic diagram of an example implementation of the circuit shown in FIG. 6.
Figure 7B:
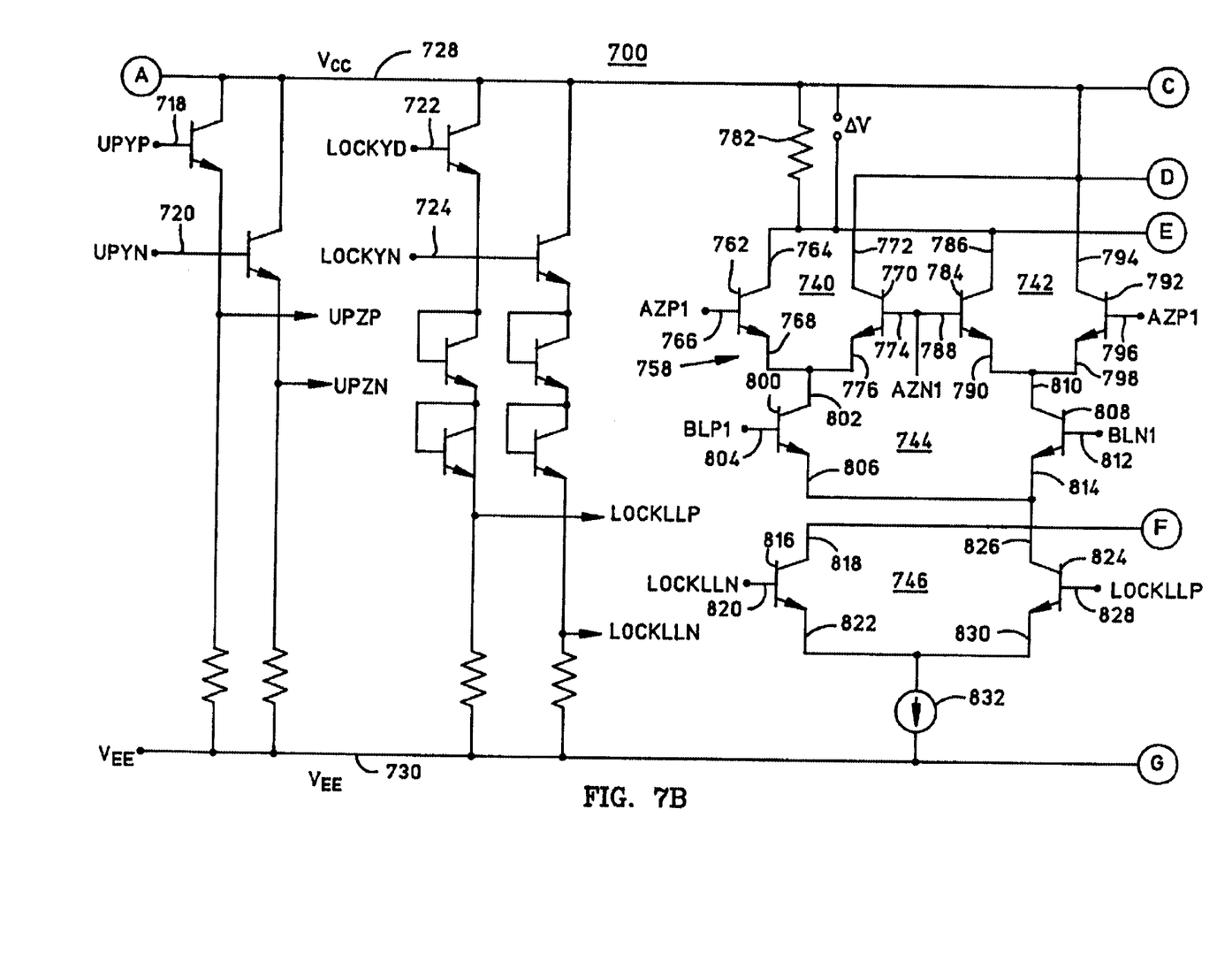
Figure 7C:
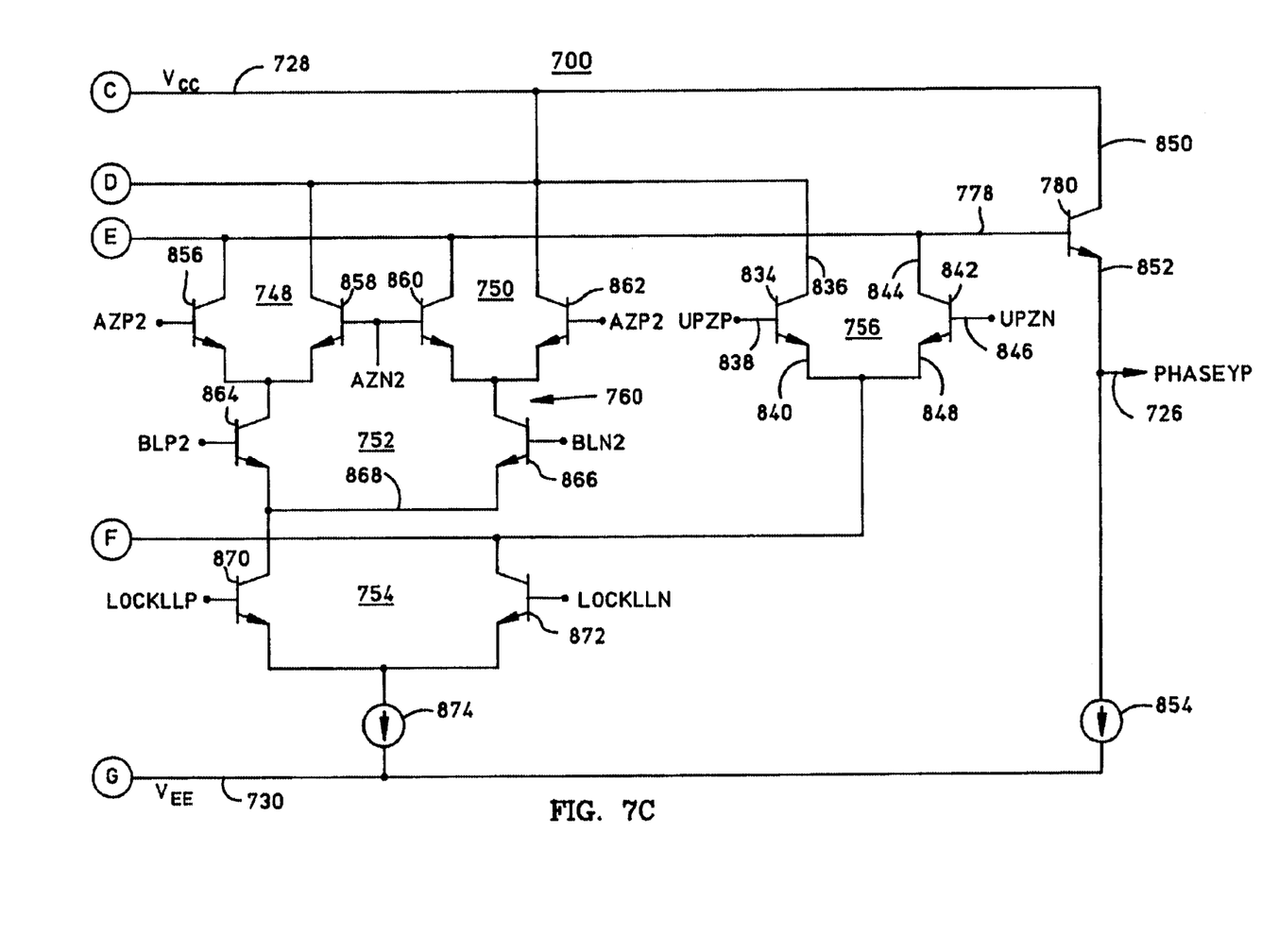

FIG. 7 is a schematic diagram of an example implementation of an XOR/SUMMER/MUX circuit 700. A first portion of circuit 700 is shown in FIG. 7A, a second portion of circuit 700 is shown in FIG. 7B, and the remainder of circuit 700 is shown in FIG. 7C. In practical embodiments, circuit 700 is realized on a single semiconductor die. Circuit 700 represents one preferred embodiment that utilizes a number of NPN bipolar junction transistors. Alternate embodiments of the present invention may utilize PNP bipolar junction transistors, CMOS transistors, and possibly other technologies and processes for implementing digital logic circuits.

The following description of circuit 700 refers to "nodes" corresponding to transistors, voltage supplies, and other points within circuit 700. As used herein, a "node" means any internal or external reference point, connection point, junction, signal line, conductive element, or the like at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description of circuit 700 refers to nodes or features being "connected" or "coupled" together. As used herein, unless stated otherwise, "connected" means that one node/feature is directly or indirectly connected to another node/feature. Likewise, unless stated otherwise, "coupled" means that one node/feature is directly or indirectly coupled to another node/feature. Thus, although the schematic shown in FIG. 7 depicts one example arrangement of elements, additional interconnecting elements, devices, features, or components may be present in an actual embodiment (assuming that the functionality of circuit 700 is not adversely affected).

Briefly, circuit 700 is configured to receive at least the following signals: a first differential input signal, which includes a true component 702 and a complementary component 704 corresponding to the true component 702; a second differential input signal, which includes a true component 706 and a complementary component 708 corresponding to the true component 706; a third differential input signal, which includes a true component 710 and a complementary component 712 corresponding to the true component 710; and a fourth differential input signal, which includes a true component 714 and a complementary component 716 corresponding to the true component 714. These various input signal components are depicted in FIG. 7A. Circuit 700 is also configured to receive a fifth differential input signal, which includes a true component 718 and a complementary component 720 corresponding to the true component 718, and a differential frequency lock signal, which includes a true component 722 and a complementary component 724 corresponding to the true component 722. These input signal components are depicted in FIG. 7B. Circuit 700 is suitably configured to process the various input signals and to generate an output signal 726. To suit the needs of the example phase detector implementation, output signal 726 is a single-ended output. Alternate embodiments of circuit 700 may be configured to generate a differential output signal if necessary for the particular application.

In accordance with conventional digital logic circuit design, circuit 700 utilizes two reference voltages provided by suitable voltage sources (not shown in FIG. 7). In the example embodiment, the Vcc reference voltage is maintained at 0.0 volts, and the Vee reference voltage is maintained at −5.2 volts. Circuit 700 maintains the Vcc reference voltage at a reference voltage node 728, and the Vee reference voltage at a reference voltage node 730. As shown in FIG. 7, a number of devices and components can be connected to reference voltage node 728 and/or to reference voltage node 730.

In the example embodiment, the various differential input signals are transformed by respective input follower architectures to obtain equivalent differential input signals at specific voltage levels corresponding to specific transistor levels. In this manner, the transistors utilized by circuit 700 are not driven into saturation by the respective input signals.

As shown in FIG. 7A, true input signal 702 (designated AYP1) serves as an input to the base node of a transistor 732. The collector node of transistor 732 is connected to reference voltage node 728, and the emitter node of transistor 732 is connected to a resistance 734. In this example, transistor 732 is implemented at a first relative transistor level. Resistance 734 (which is connected between the emitter node of transistor 732 and reference voltage node 730) can be realized with one or more resistors connected in series or in parallel, or with any number of components/devices that provide an electrical resistance suitable to establish a specified current flow from the emitter node of transistor 732. This current flow, and the associated voltage drop from the base to the emitter of transistor 732 (Vbe ≈0.8 volts) results in a 0.8 volt drop from the AYP1 signal 702 to the corresponding AZP1 signal 736. Following this methodology, the input follower architecture produces an AZN1 signal 738 corresponding to a 0.8 volt drop from the complementary input signal 704 (designated AYN1).

Generally, the input signals in FIG. 7 are designated according to the following scheme: "original" signals (true or complementary) are designated as "Y" signals; signals associated with a Vbe drop are designated as "Z" signals; signals associated with a 2Vbe drop are designated as "L" signals; and signals associated with a 3Vbe drop are designated as "LL" signals. As used herein, transistors that produce "Z" signals are implemented at the first relative transistor level, transistors that produce "L" signals are implemented at the second relative transistor level, and transistors that produce "LL" signals are implemented at the third relative transistor level.

In the context of a practical embodiment, a logic high "Y" signal may be indicated with a true component of −0.8 volts and a complementary component of −1.1 volts. Assuming that Vbe=0.8 volts, the equivalent "Z" signal would be indicated with a true component of −1.6 volts and a complementary component of −1.9 volts, the equivalent "L" signal would be indicated with a true component of −2.4 volts and a complementary component of −2.7 volts, and the equivalent "LL" signal would be indicated with a true component of −3.2 volts and a complementary component of −3.5 volts. A "family" of signals generated from an original input signal architecture includes equivalent input signals in that each signal in a family will convey the same logic high/low information at any given clock cycle. Accordingly, the following description of circuit 700 may not distinguish one equivalent input signal from another.

The different input signal "levels" correspond to the different transistor levels utilized by a practical circuit 700. The following signals depicted in connection with the input follower sections of FIG. 7 correspond to connection points or nodes depicted elsewhere in FIG. 7: AZP1, AZN1, AZP2, AZN2, BLP1, BLN1, BLP2, BLN2, UPZP, UPZN, LOCKLLP, and LOCKLLN. Signal AZP1 corresponds to the true component 702 of the first differential input signal, signal AZN1 corresponds to the complementary component 704 of the first differential input signal, signal AZP2 corresponds to the true component 710 of the third differential input signal, signal AZN2 corresponds to the complementary component 712 of the third differential input signal, signal BLP1 corresponds to the true component 706 of the second differential input signal, signal BLN1 corresponds to the complementary component 708 of the second differential input signal, signal BLP2 corresponds to the true component 714 of the fourth differential input signal, signal BLN2 corresponds to the complementary component 716 of the fourth differential input signal, signal UPZP corresponds to the true component 718 of the fifth differential input signal, signal UPZN corresponds to the complementary component 720 of the fifth differential input signal, LOCKLLP corresponds to the true component 722 of the differential select signal, and LOCKLLN corresponds to the complementary component 724 of the differential select signal.

Referring now to FIG. 7B and 7C, circuit 700 preferably comprises a plurality of transistors arranged as a plurality of differential transistor pairs. The following description refers to nine differential transistor pairs (identified by reference numbers 740, 742, 744, 746, 748, 750, 752, 754, and 756). Each of the differential transistor pairs includes two transistors, and each of the transistors includes a collector node, a base node, and an emitter node. Each of the differential transistor pairs includes a common emitter node, i.e., the two emitter nodes of the respective transistors are connected together.

Differential transistor pairs 740/742/744 are utilized by an XOR arrangement 758, and differential transistor pairs 748/750/752 are utilized by another XOR arrangement 760. XOR arrangement 758 is suitably configured to perform an XOR operation on the first and second differential input signals, while XOR arrangement 760 is suitably configured to perform a concurrent XOR operation on the third and fourth differential input signals. In this context, an XOR operation results in a logic high output signal when one input signal represents a logic high and the other input signal represents a logic low. Conversely, the XOR operation results in a logic low output signal when: (1) both input signals represent logic high values; or (2) both input signals represent logic low values.

In one operating mode, circuit 700 is configured to sum to respective outputs of XOR arrangements 758/760 to generate a summed XOR output voltage upon which output signal 726 is based. In this regard, if the operation of XOR arrangement 758 results in a logic low state and the operation of XOR arrangement 760 also results in a logic low state, then the voltage of output signal 726 will be at a relatively low level. If the operation of XOR arrangement 758 results in a logic high state and the operation of XOR arrangement 760 also results in a logic high state, then the voltage of output signal 726 will be at a relatively high level. If the operation of XOR arrangements 758/760 results in one logic low state and one logic high state, then the voltage of output signal 726 will be at a relatively intermediate level (i.e., a level between the low level and the high level). The operation of circuit 700 is described in more detail below.

Differential transistor pair 740 includes a transistor 762 having a collector node 764, a base node 766, and an emitter node 768, and a transistor 770 having a collector node 772, a base node 774, and an emitter node 776. Using the example relative designations, transistors 762 and 770 are each implemented at the second transistor level. Collector node 764 represents the node upon which the XOR output (corresponding to XOR arrangement 758) is generated. Collector node 764 is connected to (or corresponds to): a base node 778 of an output transistor 780, one end of a resistance 782, and collector nodes associated with other transistors utilized by circuit 700. This common node may be referred to herein as the output voltage node of circuit 700. The other end of resistance 782 is connected to reference voltage node 728, i.e., resistance 782 is connected between reference voltage node 728 and the output voltage node of the XOR arrangements 758/760. Resistance 782 can be realized with one or more resistors connected in series or in parallel, or with any number of components/devices that provide an electrical resistance suitable to establish a specified voltage drop (assuming a known current) across resistance 782. Collector node 772 of transistor 770 is connected to (or corresponds to) reference voltage node 728 and to collector nodes associated with other transistors utilized by circuit 700. Collector node 764 corresponds to a first collector node of XOR arrangement 758, while collector node 772 corresponds to a second collector node of XOR arrangement 758.

Base node 766 is suitably configured to receive the true component of the first differential input signal (identified as the AZP1 signal in FIG. 7B), and base node 774 is suitably configured to receive the complementary component of the first differential input signal (identified as the AZN1 signal in FIG. 7B). Emitter nodes 768/776 are connected together to form a common emitter node for differential transistor pair 740.

Differential transistor pair 742 includes a transistor 784 having a collector node 786, a base node 788, and an emitter node 790, and a transistor 792 having a collector node 794, a base node 796, and an emitter node 798. Using the example relative designations, transistors 784 and 792 are each implemented at the second transistor level. Collector node 786 is connected to (or corresponds to): collector node 764 of transistor 762, base node 778 of output transistor 780, one end of resistance 782, and collector nodes associated with other transistors utilized by circuit 700. Collector node 794 is connected to (or corresponds to) collector node 772 of transistor 770, to reverence voltage node 728, and to collector nodes associated with other transistors utilized by circuit 700.

Base node 788 is suitably configured to receive the complementary component of the first differential input signal (identified as the AZN1 signal in FIG. 7B), and base node 796 is suitably configured to receive the true component of the first differential input signal (identified as the AZP1 signal in FIG. 7B). Although not a requirement of the present invention, base nodes 774/788 are connected together in circuit 700. Emitter nodes 790/798 are connected together to form a common emitter node for differential transistor pair 742.

Differential transistor pair 744 includes a transistor 800 having a collector node 802, a base node 804, and an emitter node 806, and a transistor 808 having a collector node 810, a base node 812, and an emitter node 814. Using the example relative designations, transistors 800 and 808 are each implemented at the third transistor level. Collector node 802 is connected to (or corresponds to) the common emitter node of differential transistor pair 740, and collector node 810 is connected to (or corresponds to) the common emitter node of differential transistor pair 742.

Base node 804 is suitably configured to receive the true component of the second differential input signal (identified as the BLP1 signal in FIG. 7B), and base node 812 is suitably configured to receive the complementary component of the second differential input signal (identified as the BLN1 signal in FIG. 7B). Emitter nodes 806/814 are connected together to form a common emitter node for differential transistor pair 744. This common emitter node also corresponds to a common emitter node for XOR arrangement 758.

Differential transistor pair 746 represents a portion of a selection or multiplexer arrangement, which is coupled to XOR arrangement 758, to XOR arrangement 760, and to differential transistor pair 756 (differential transistor pair 754 represents another portion of the multiplexer arrangement). Differential transistor pair 746 includes a transistor 816 having a collector node 818, a base node 820, and an emitter node 822, and a transistor 824 having a collector node 826, a base node 828, and an emitter node 830. Using the example relative designations, transistors 816 and 824 are each implemented at the fourth transistor level. Collector node 818 is connected to (or corresponds to) other transistors utilized by circuit 700, as described in more detail below, and collector node 826 is connected to (or corresponds to) the common emitter node of differential transistor pair 744.

Base node 820 is suitably configured to receive the complementary component of the differential frequency lock signal (identified as the LOCKLLN signal in FIG. 7B), and base node 828 is suitably configured to receive the true component of the differential frequency lock signal (identified as the LOCKLLP signal in FIG. 7B). Emitter nodes 822/830 are connected together to form a common emitter node for differential transistor pair 746. This common emitter node is connected to a current source 832 that provides a constant current (to within practical tolerances) flow from reference voltage node 728 to reference voltage node 730, via conductive paths through active transistors, resistances, and possibly other elements or components of circuit 700. In accordance with one practical embodiment, current source 832 is realized with a transistor having a reference voltage applied to the base and a resistance between the emitter and reference voltage node 730. For practical embodiments, the reference voltage and resistance are selected such that current source 832 provides a substantially constant current within the range of 0.5 mA to 6.0 mA. In the example embodiment, current source 832 provides a substantially constant current of 1.0 mA. In practice, current source 832 may be realized with any number of transistors, resistors, capacitors, and/or other components or elements.

Differential transistor pair 756 includes a transistor 834 having a collector node 836, a base node 838, and an emitter node 840, and a transistor 842 having a collector node 844, a base node 846, and an emitter node 848. Using the example relative designations, transistors 834 and 842 are each implemented at the second transistor level. Collector node 836 is connected to (or corresponds to): reference voltage node 728, collector node 772 of transistor 770, collector node 794 of transistor 792, and collector nodes associated with other transistors utilized by circuit 700. Collector node 844 is connected to (or corresponds to): collector node 764 of transistor 762, one end of resistance 782, collector node 786 of transistor 784, base node 778 of output transistor 780, and collector nodes associated with other transistors utilized by circuit 700.

Base node 838 is suitably configured to receive the true component of the frequency detect signal (identified as the UPZP signal in FIG. 7C), and base node 846 is suitably configured to receive the complementary component of the frequency detect signal (identified as the UPZN signal in FIG. 7C). In this regard, differential transistor pair 756 represents an input arrangement that receives a fifth differential input signal for handling by circuit 700. Emitter nodes 840/848 are connected together to form a common emitter node for differential transistor pair 756. This common emitter node is connected to (or corresponds to) collector node 818 of transistor 816.

Output transistor 780 includes a collector node 850, base node 778, and an emitter node 852. Collector node 850 is connected to (or corresponds to) reference voltage node 728, and emitter node 852 is connected to a current source 854. Emitter node 852, which represents an output node of circuit 700, provides output signal 726, which is derived or otherwise based upon voltage levels present at base node 778. Accordingly, XOR arrangements 758/760 and differential transistor pair 756 are each coupled to the output node of circuit 700 (i.e., emitter node 852) via output transistor 780. Current source 854 preferably provides a constant current (to within practical tolerances) flow from emitter node 852 to reference voltage node 730, via conductive paths through active transistors, resistances, and possibly other elements or components of circuit 700. In accordance with one practical embodiment, current source 854 is realized with a resistance coupled between emitter node 852 and reference voltage node 730. In practical embodiments, the resistance is selected such that current source 854 provides a substantially constant current within the range of 1.0 mA to 4.0 mA. In the example embodiment, current source 854 provides a substantially constant current of 1.0 mA.

Differential transistor pairs 748, 750, 752, and 754 are arranged and interconnected in substantially the same manner as differential transistor pairs 740, 742, 744, and 746, respectively. Accordingly, the following description of differential transistor pairs 748, 750, 752, and 754 omits some common features described above.

Differential transistor pair 748 includes a transistor 856 and a transistor 858. The base node of transistor 856 is configured to receive the true component of the third differential input signal (identified as the AZP2 signal in FIG. 7C), and the base node of transistor 858 is configured to receive the complementary component of the third differential input signal (identified as the AZN2 signal in FIG. 7C). Differential transistor pair 750 includes a transistor 860 and a transistor 862. The base node of transistor 860 is configured to receive the complementary component of the third differential input signal, and the base node of transistor 862 is configured to receive the true component of the third differential input signal.

Differential transistor pair 752 includes a transistor 864 and a transistor 866. The base node of transistor 864 is configured to receive the true component of the fourth differential input signal (identified as the BLP2 signal in FIG. 7C), and the base node of transistor 866 is configured to receive the complementary component of the fourth differential input signal (identified as the BLN2 signal in FIG. 7C). The emitter node of transistor 864 is connected to the emitter node of transistor 866 to form a common emitter node 868. Common emitter node 868 also corresponds to a common emitter node for XOR arrangement 760.

Differential transistor pair 754 includes a transistor 870 and a transistor 872. The base node of transistor 870 is configured to receive the true component of the differential frequency lock signal (identified as the LOCKLLP signal in FIG. 7C), and the base node of transistor 872 is configured to receive the complementary component of the differential frequency lock signal (identified as the LOCKLLN signal in FIG. 7C). The collector node of transistor 870 is connected to (or corresponds to) common emitter node 868, and the collector node of transistor 872 is connected to (or corresponds to) the common emitter node of differential transistor pair 756 and to collector node 818 of transistor 816 (see FIG. 7B).

Regarding the operation of circuit 700, differential transistor pairs 746/754 represent a selection or MUX arrangement that operates in a first mode when the select signal (LOCKLLP and LOCKLLN) indicates a first state, and operates in a second mode when the select signal indicates a second state. In one operating mode, XOR arrangements 758/760 influence voltage levels at the output voltage node and, consequently, voltage levels of output signal 726. In the other operating mode, differential transistor pair 756 influences voltage levels at the output voltage node, and, consequently, voltage levels of output signal 726.

In the example embodiment, if the select signal represents a logic low (i.e., the LOCKLLP voltage is low and the LOCKLLN voltage is high), then transistors 824/870 are off and transistors 816/872 are on. Consequently, no current flows through transistor 824, no current flows through XOR arrangement 758, no current flows through transistor 870, and no current flows through XOR arrangement 760. Current will flow through differential pair 756, however (via transistors 816/872), such that differential pair 756 influences the voltage levels at base node 778 of output transistor 780. In turn, these voltage levels influence output signal 726. In this mode, the MUX arrangement selects differential transistor pair 756 for operation in response to the select signal.

Assuming that output signal 726 is only influenced by differential transistor pair 756 (i.e., the select signal represents a logic low), then the logic level represented by output.signal 726 will be the same logic level represented by the fifth input signal (UPZP and UPZN). As mentioned above, the fifth input signal corresponds to a frequency detect signal generated by a suitable frequency detection procedure. When the fifth input signal represents a logic high (i.e., the UPZP voltage is high and the UPZN voltage is low), transistor 834 is on and transistor 842 is off. As a result, current flows through transistor 834, no current flows through transistor 842, there is no voltage drop across resistance 782, the voltage at base node 778 is approximately equal to Vcc (due to practical characteristics of circuit 700, this voltage may be slightly less than Vcc, e.g., 10 mV less than Vcc), and the voltage of output signal 726 is approximately equal to (Vcc−Vbe) (which represents a logic high). Conversely, when the fifth input signal represents a logic low, no current flows through transistor 834, current flows through transistor 842 and through resistance 782, the voltage at base node 778 is equal to (Vcc−ΔV) (where ΔV is the voltage drop across resistance 782), and the voltage of output signal 726 equals (Vcc−ΔV−Vbe) (which represents a logic low). In accordance with one practical embodiment, ΔV is approximately 400 mV.

Referring again to differential transistor pairs 746/754, if the select signal represents a logic high (i.e., the LOCKLLP voltage is high and the LOCKLLN voltage is low), then transistors 824/870 are on and transistors 816/872 are off. Consequently, current flows through transistors 824/870, no current flows through transistors 816/872, and differential transistor pair 756 is rendered inactive. Current may flow through XOR arrangements 758/760, however, such that XOR arrangements 758/760 influence the voltage levels at base node 778 of output transistor 780. In turn, these voltage levels influence output signal 726. In this mode, the MUX arrangement selects XOR arrangements 758/760 for operation in response to the select signal.

XOR arrangement 758, which processes the first and second input signals, and XOR arrangement 760, which processes the third and fourth input signals, operate in an equivalent manner. Accordingly, significant portions of the following description of XOR arrangement 758 also apply to XOR arrangement 760.

Assuming that current flows through transistor 824, XOR arrangement 758 operates as follows. Differential transistor pair 744 functions as a switch that determines whether to "activate" differential transistor pair 740 or differential transistor pair 742. In the example embodiment, if the second input signal represents a logic high (i.e., the BLP1 voltage is high and the BLN1 voltage is low), then current flows through transistor 800 and through differential transistor pair 740, and no current flows through transistor 808 or through differential transistor pair 742. If the first input signal also represents a logic high (i.e., the AZP1 voltage is high and the AZN1 voltage is low), then current flows through transistor 762, and no current flows through transistor 770. Under these circumstances (representing a logic low output condition for XOR arrangement 758), a current flows through resistance 782, where this current is dictated at least in part by current source 832. If, however, the first input signal represents a logic low (i.e., the AZP1 voltage is low and the AZN1 voltage is high), then no current flows through transistor 762, and current flows condition for XOR arrangement 758), XOR arrangement 758 does not permit current flow through resistance 782.

Referring again to differential transistor pair 744, if the second input signal represents a logic low (i.e., the BLP1 voltage is low and the BLN1 voltage is high) rather than a logic high, then current flows through transistor 808 and through differential transistor pair 742, and no current flows through transistor 800 or through differential transistor pair 740. If the first input signal represents a logic high, then current flows through transistor 792, and no current flows through transistor 784. Under these circumstances (representing a logic high output condition for XOR arrangement 758), XOR arrangement 758 does not permit current flow through resistance 782. If, however, the first input signal also represents a logic low, then no current flows through transistor 792, and current flows through transistor 784. Under these circumstances (representing a logic low output condition for XOR arrangement 758), a current flows through resistance 782, where this current is dictated at least in part by current source 832.

As described above, differential transistor pairs 746/754 operate in concert such that transistor 870 is on (off) when transistor 824 is on (off). Assuming that current flows through transistor 870, XOR arrangement 760 operates as described above in connection with XOR arrangement 758. In this regard, if the fourth input signal represents a logic high (i.e., the BLP2 voltage is high and the BLN2 voltage is low) and the third input signal represents a logic high (i.e., the AZP2 voltage is high and the AZN2 voltage is low), then a current flows through resistance 782, where this current is dictated at least in part by a current source 874 (current source may, but need not be, designed to provide the same constant current as current source 832). If, however, the fourth input signal represents a logic high and the third input signal represents a logic low (i.e., the AzP2 voltage is low and the AZN2 voltage is high), then XOR arrangement 760 does not permit current flow through resistance 782.

If the fourth input signal represents a logic low (i.e., the BLP2 voltage is low and the BLN2 voltage is high) rather than a logic high, and if the third input signal represents a logic high, then XOR arrangement 760 does not permit current flow through resistance 782. If, however, the fourth input signal represents a logic low and the third input signal also represents a logic low, then a current flows through resistance 782, where this current is dictated at least in part by current source 874.

The concurrent operation of XOR arrangements 758/760 causes more or less current to flow through resistance 782, depending upon the respective logic output results of each XOR arrangement 758/760. Different current flowing through resistance 782 results in different voltage drops across resistance 782 and, consequently, different voltage levels at output signal 726. In this manner, circuit 700 sums the outputs of XOR arrangements 758/760. More particularly, if the output of XOR arrangement 758 is a logic low and the output of XOR arrangement 760 is a logic low, then a relatively high current flows through resistance 782. This relatively high current includes one component dictated by current source 832 and one component dictated by current source 874. This relatively high current results in a relatively high ΔV drop across resistance 782 and, in turn, a relatively low voltage level at output signal 726.

If the output of XOR arrangement 758 is a logic high and the output of XOR arrangement 760 is a logic high, then no current flows through resistance 782. Consequently, a relatively high voltage level (approximately equal to Vcc−Vbe) appears at output signal 726.

If the output of XOR arrangement 758 is a logic low and the output of XOR arrangement 760 is a logic high, then a relatively intermediate current flows through resistance 782. This relatively intermediate current includes a component dictated by current source 832; current source 874 does not contribute any component to this current. This relatively intermediate current results in a relatively intermediate ΔV drop across resistance 782 and, in turn, a relatively intermediate voltage level at output signal 726. Similarly, if the output of XOR arrangement 758 is a logic high and the output of XOR arrangement 760 is a logic low, then a relatively intermediate voltage level appears at output signal 726.

In a practical high speed data communication embodiment, the input data levels exhibit rapid transitions, and the corresponding final steady state values may not be fully reached. Nonetheless, the currents flow through the various transistors in some intermediate fashion. For example, at a given moment, a transistor may not be completely on or completely off, thus resulting in a "partial" current flow. In this regard, output signal 726 may correspond to various intermediate voltage levels.

Referring to FIG. 3, prior art XOR circuit 300 results in one gate delay corresponding to the two input signals. Referring to FIG. 4, the prior art summer/MUX component 400 results in one gate delay corresponding to the AZ and BZ input signals (i.e., the XOR output signals 302). Consequently, the prior art configuration results in a total of two gate delays when handling the phase detect signal. In contrast, integrated XOR/SUMMER/MUX circuit 700 only includes a single gate delay caused by the XOR arrangements, which operate in parallel. The reduction in propagation delay enables circuit 700 to operate at a higher speed relative to the prior art configuration.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An integrated XOR/SUMMER/MUX device comprising:
    a reference voltage node;
    an output voltage node;
    a first XOR arrangement comprising a first collector node corresponding to said reference voltage node, a second collector node corresponding to said output voltage node, and a first common emitter node;
    a second XOR arrangement comprising a third collector node corresponding to said reference voltage node, a fourth collector node corresponding to said output voltage node, and a second common emitter node;
    a differential transistor pair comprising one transistor having a collector connected to said reference voltage node, another transistor having a collector connected to said output voltage node, and a third common emitter node; and
    a MUX arrangement comprising a fifth collector node corresponding to said first common emitter node, a sixth collector node corresponding to said second common emitter node, and a seventh collector node corresponding to said third common emitter node.

2. A device according to claim 1, further comprising a resistance connected between said reference voltage node and said output voltage node.

3. A device according to claim 1, further comprising an output transistor having a base node corresponding to said output voltage node, an eighth collector node corresponding to said reference voltage node, and an emitter node connected to a current source, said emitter node providing an output signal derived from voltage levels at said output voltage node.

4. A device according to claim 3, wherein said output transistor generates said output signal as a single-ended signal.

5. A device according to claim 1, wherein:

said MUX arrangement is configured to receive a select signal;

if said MUX arrangement is operating in a first mode controlled by said select signal, said first and second XOR arrangements influence voltage levels at said output voltage node; and if said MUX arrangement is operating in a second mode controlled by said select signal, said differential transistor pair influences voltage levels at said output voltage node.

6. An integrated XOR/SUMMER/MUX device comprising:

a reference voltage node;

an output voltage node;

a first XOR arrangement coupled to said reference voltage node and to said output voltage node, said first XOR arrangement being configured to perform an XOR operation based upon a first input signal and a second input signal;

a second XOR arrangement coupled to said reference voltage node and to said output voltage node, said second XOR arrangement being configured to perform an XOR operation based upon a third input signal and a fourth input signal;

an input arrangement coupled to said reference voltage node and to said output voltage node, said input arrangement being configured to receive a fifth input signal; and a MUX arrangement coupled to said first XOR arrangement, to said second XOR arrangement, and to said input arrangement, said MUX arrangement being configured to select either said input arrangement or said first and second XOR arrangements for operation in response to a select signal.

7. A device according to claim 6, wherein said first XOR arrangement comprises:

a first differential transistor pair having a first common emitter node, a first collector node connected to said output voltage node, a second collector node connected to said reference voltage node, a first base node configured to receive the true component of said first input signal, and a second base node configured to receive the complementary component of said first input signal;

a second differential transistor pair having a second common emitter node, a third collector node connected to said output voltage node, a fourth collector node connected to said reference voltage node, a third base node configured to receive the complementary component of said first input signal, and a fourth base node configured to receive the true component of said first input signal; and a third differential transistor pair having a third common emitter node connected to said MUX arrangement, a fifth collector node connected to said first common emitter node, a sixth collector node connected to said second common emitter node, a fifth base node configured to receive the true component of said second input signal, and a sixth base node configured to receive the complementary component of said second input signal.

8. A device according to claim 7, wherein said second XOR arrangement comprises:

a fourth differential transistor pair having a fourth common emitter node, a seventh collector node connected to said output voltage node, an eighth collector node connected to said reference voltage node, a seventh base node configured to receive the true component of said third input signal, and an eighth base node configured to receive the complementary component of said third input signal;

a fifth differential transistor pair having a fifth common emitter node, a ninth collector node connected to said output voltage node, a tenth collector node connected to said reference voltage node, a ninth base node configured to receive the complementary component of said third input signal, and a tenth base node configured to receive the true component of said third input signal; and a sixth differential transistor pair having a sixth common emitter node connected to said MUX arrangement, an eleventh collector node connected to said third common emitter node, a twelfth collector node connected to said fourth common emitter node, an eleventh base node configured to receive the true component of said fourth input signal, and a twelfth base node configured to receive the complementary component of said fourth input signal.

9. A device according to claim 8, wherein said input arrangement comprises a seventh differential transistor pair having a seventh common emitter node connected to said MUX arrangement, a thirteenth collector node connected to said reference voltage node, a fourteenth collector node connected to said output voltage node, a thirteenth base node configured to receive the true component of said fifth input signal, and a fourteenth base node configured to receive the complementary component of said fifth input signal.

10. A device according to claim 9, wherein said MUX arrangement comprises:

an eighth differential transistor pair having an eighth common emitter node connected to a first current source, a fifteenth collector node connected to said seventh common emitter node, a sixteenth collector node connected to said third common emitter node, a fifteenth base node configured to receive the complementary component of said select signal, and a sixteenth base node configured to receive the true component of said select signal; and a ninth differential transistor pair having a ninth common emitter node connected to a second current source, a seventeenth collector node connected to said sixth common emitter node, an eighteenth collector node connected to said seventh common emitter node, a seventeenth base node configured to receive the true component of said select signal, and an eighteenth base node configured to receive the complementary component of said select signal.

11. A device according to claim 10, further comprising a resistance connected between said reference voltage node and said output voltage node.

12. A device according to claim 10, further comprising an output transistor having a nineteenth base node connected to said output voltage node, a nineteenth collector node connected to said reference voltage node, and an output emitter node connected to a third current source, said output emitter node providing an output signal derived from voltage levels at said output voltage node.

13. A device according to claim 12, wherein said output transistor generates said output signal as a single-ended signal.

14. A device according to claim 12, wherein:
   if said MUX arrangement is operating in a first mode controlled by said select signal, said first and second XOR arrangements influence said output signal; and
   if said MUX arrangement is operating in a second mode controlled by said select signal, said input arrangement influences said output signal.

15. An integrated XOR/SUMMER/MUX device comprising:
   an output node configured to provide an output signal;
   a first XOR arrangement coupled to said output node, said first XOR arrangement comprising at least one transistor implemented at a first relative transistor level and at least one transistor implemented at a second relative transistor level, said first XOR arrangement being configured to receive a first input signal and a second input signal and to influence a summed XOR output voltage based upon said first and second input signals;
   a second XOR arrangement coupled to said output node, said second XOR arrangement comprising at least one transistor implemented at said first relative transistor level and at least one transistor implemented at said second relative transistor level, said second XOR arrangement being configured to receive a third input signal and a fourth input signal and to influence said summed XOR output voltage based upon said third and fourth input signals; and
   a MUX arrangement coupled to said first and second XOR arrangements, said MUX arrangement comprising at least one transistor implemented at a third relative transistor level, said MUX arrangement being configured to receive a select signal; wherein
      in response to a first state of said select signal, said first and second XOR arrangements influence said output signal; and
      in response to a second state of said select signal, a third input signal received by said XOR/SUMMER/MUX device output influences said output signal.

16. A device according to claim 15, further comprising a differential transistor pair coupled to said output node and to said MUX arrangement, said differential transistor pair being configured to receive said third input signal.

17. A device according to claim 16, wherein said differential transistor pair comprises at least one transistor implemented at said first relative transistor level.

18. A device according to claim 16, wherein said first and second XOR arrangements and said differential transistor pair are each coupled to said output node via an output transistor.

* * * * *